United States Patent

Norell et al.

[11] Patent Number: 5,918,516
[45] Date of Patent: *Jul. 6, 1999

[54] METHOD OF FORMING I/O COLUMNS WITH OPEN ENDS THAT ARE FREE OF CRATER-LIKE VOIDS

[75] Inventors: Ronald Allen Norell, Oceanside; Kenneth Walter Economy, Escondido, both of Calif.

[73] Assignee: Unisys Corporation, Blue Bell, Pa.

[*] Notice: This patent issued on a continued prosecution application filed under 37 CFR 1.53(d), and is subject to the twenty year patent term provisions of 35 U.S.C. 154(a)(2).

[21] Appl. No.: 08/797,015
[22] Filed: Feb. 7, 1997
[51] Int. Cl.$^6$ .................... B26D 3/16; B26D 1/00
[52] U.S. Cl. .................... 83/13; 83/542; 83/929.2; 83/942
[58] Field of Search .................... 83/929.2, 942, 83/542, 13

[56] References Cited

U.S. PATENT DOCUMENTS

| | | | |
|---|---|---|---|
| 3,232,158 | 2/1966 | Breeding | 83/942 |
| 3,307,442 | 3/1967 | Imhoff | 83/942 |
| 4,157,048 | 6/1979 | Lemmer | 83/929.2 |
| 4,167,132 | 9/1979 | Zontelli | 83/929.2 |
| 4,187,751 | 2/1980 | Barnacle | 83/929.2 |
| 4,436,006 | 3/1984 | Nakamura et al. | 83/929.2 |
| 4,624,160 | 11/1986 | Linker et al. | 83/942 |
| 4,911,046 | 3/1990 | Goss et al. | 83/929.2 |
| 5,454,159 | 10/1995 | Norell | 29/834 |

*Primary Examiner*—M. Rachuba
*Assistant Examiner*—Sean Pryor
*Attorney, Agent, or Firm*—Charles J. Fassbender; Mark T. Starr; Steven R. Petersen

[57] ABSTRACT

A method of cutting input/output columns on an electronic component includes the steps of: providing a shear plate which has a thickness that is less than the length of the columns and which has respective holes for receiving all of the columns; inserting the columns into the holes until a portion of the columns extend past the shear plate; placing a blade, with a cutting edge, at an acute angle against the shear plate such that only the cutting edge of the blade touches the shear plate; and, sliding the cutting edge of the blade against shear plate and through the portion of the columns which extend past the shear plate, while keeping the blade at the acute angle. With this method, crater-like voids and burrs on the cut ends of the columns are eliminated.

11 Claims, 6 Drawing Sheets

METHOD OF FORMING I/O COLUMNS WITH OPEN ENDS THAT ARE FREE OF CRATER-LIKE VOIDS

BACKGROUND OF THE INVENTION

This invention relates to integrated circuit packages; and more particularly, it relates to methods of cutting input/output columns on an integrated circuit package to a predetermined length.

In the prior art, integrated circuit packages have been disclosed which include a body that completely encloses an integrated circuit chip and include multiple input/output columns which extend perpendicularly from the body. Each input/output column is connected by microscopic conductors within the body of the integrated circuit package to the integrated circuit chip, and thus the input/output columns provide the means by which electrical signals are sent to and received from the chip.

One method of casting the input/output columns on the body of the integrated circuit package is described in the prior art in U.S. Pat. No. 5,454,159. In that patent, FIGS. 6 and 7 illustrate a template which has a plurality of cylindrical-shaped holes that provide a pattern for the input/output columns. This template is placed on the body of the integrated circuit package such that the holes of the template are aligned with locations on the body of the package where the input/output columns are to be formed. Then the holes in the template are filled with solder balls, and the assembly of the template on the body of the package is sent through a belt furnace where the solder balls are melted and resolidified.

After the input/output columns have been formed on the integrated circuit package as described above, they can be connected to a printed circuit board by soldering the open ends of the input/output columns to respective I/O pads on the printed circuit board. In this step, the solder which is used has a lower melting temperature than the solder balls from which the columns were made so that the columns stay in a solid state.

However, prior to such a soldering step, all of the input/output columns can be cut to a predetermined length. Such a cutting operation is performed to trim all of the input/output columns to the same length and thereby insure that the ends of all of the input/output columns make contact with their corresponding I/O pads on the printed circuit board.

In the prior art, an apparatus which has been used to cut the input/output columns on an integrated circuit package is shown in FIG. 1. This apparatus includes a shear plate 10 and a blade 11. The shear plate 10 has a plurality of holes 10a which match the pattern of the input/output columns on the integrated circuit package; and those columns are passed through the holes 10a as shown in FIG. 1. Then to cut the input/output columns, a surface 11a of the blade is placed flush against the surface of the shear plate 10 from which the input/output columns extend; and while the blade is held in that position, the blade is slid against the shear plate through the input/output columns.

However, a problem with the FIG. 1 apparatus is that at a microscopic level, surface 11a of the blade inherently has a certain degree of roughness; and similarly, the surface of the shear plate from which the input/output columns extend also has a certain degree of roughness. Consequently, a small gap inherently exists between the blade 11 and the shear plate 10.

Thus, when the blade 11 is pushed through the input/output columns, a small amount of debris from the columns can get caught in the gap between the blade and the shear plate. This debris will build up as a smear on surface of 11a of the blade while each input/output column is cut. In turn, this smear produces defects in the cut ends of the columns such as those which are shown in FIGS. 5 and 6 and which are described in detail in the "Detailed Description."

Accordingly, a primary object of the invention is to provide an improved method of cutting the input/ouput columns on an integrated circuit package by which the above defects are eliminated.

BRIEF SUMMARY OF THE INVENTION

In accordance with the present invention, input/output columns on an integrated circuit package are cut by the steps of: providing a shear plate which has a thickness that is less than the length of the columns and which has respective holes for receiving all of the columns; inserting the columns into the holes until a portion of the columns extend past the shear plate; placing a blade, with a cutting edge, at an acute angle against the shear plate such that only the cutting edge of the blade touches the shear plate; and, sliding the cutting edge of the blade against shear plate and through the portion of the columns which extend past the shear plate, while keeping the blade at the acute angle.

When the input/output columns are cut as described above, one important attribute which those columns acquire is that their cut ends are free of any crater-like voids. Also, another important attribute which the input/output columns acquire when they are cut as described above is that the cut ends of the columns are free of any burrs. These attributes are evident from inspection of FIG. 4 which is a microphotograph of the end of an input/output column which was cut as described above.

Figure 1:
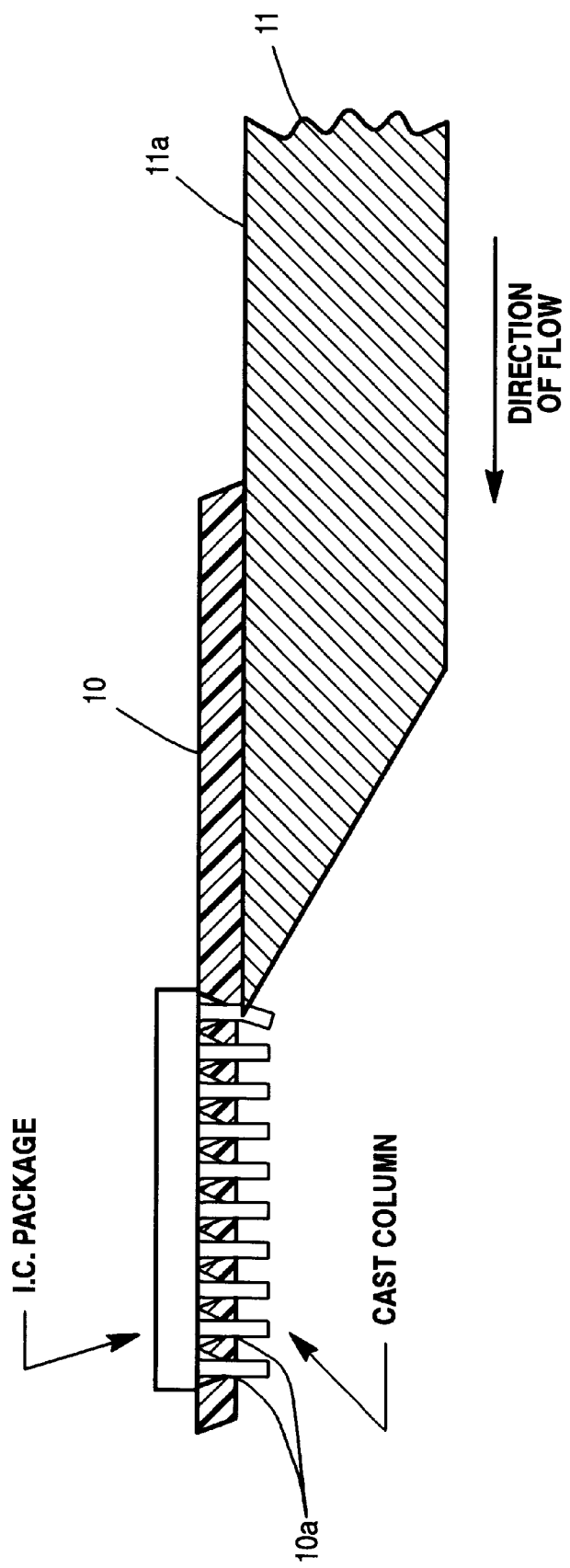
FIG. 1 shows an apparatus by which input/output columns on an integrated circuit package have been cut in the prior art.
Figure 2:
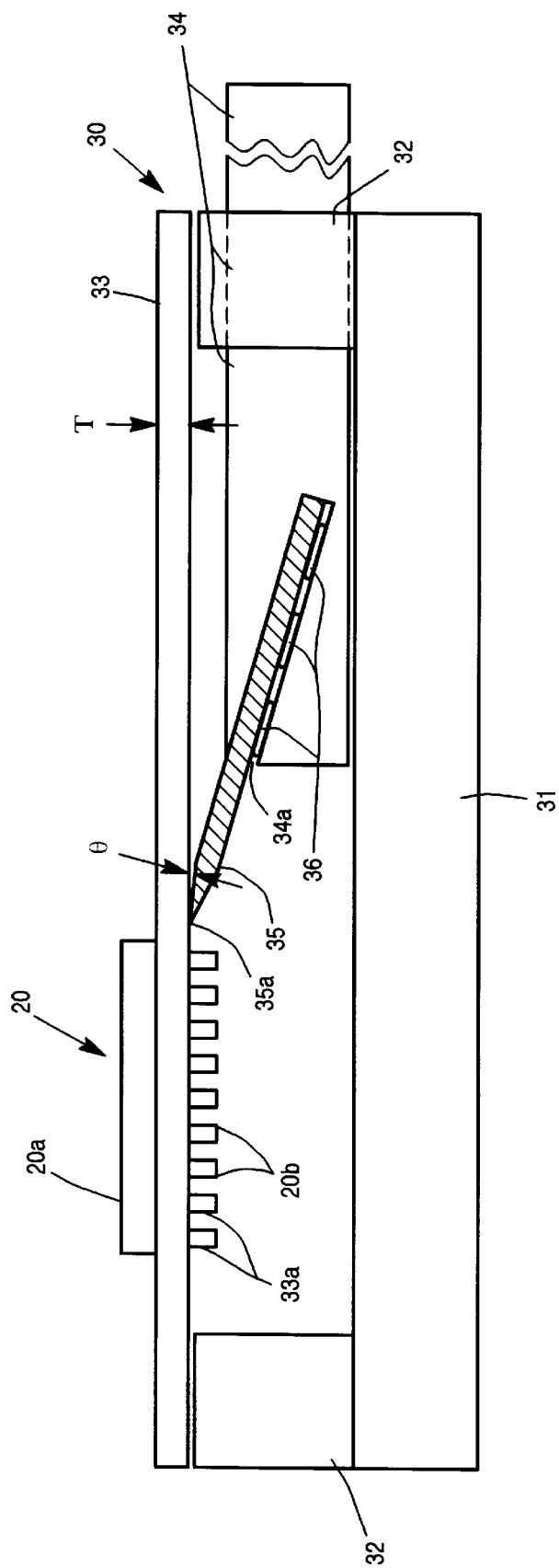
FIG. 2 shows an apparatus by which input/output columns on an integrated circuit package are cut in accordance with the present invention.

DETAILED DESCRIPTION:

In FIG. 2, reference numeral 20 identifies an integrated circuit package which has a body 20a that completely encloses an integrated circuit chip (not shown), and has multiple input/output columns 20b which extend perpendicularly from the body 20a. These I/O columns 20b are made of a tin-lead alloy, and they are twenty-two mils in diameter. Each I/O column is connected, by microscopic conductors (not shown) within the body 20a, to the integrated circuit chip, and thus the columns provide the means by which electrical signals are sent to and received from the chip.

Also in FIG. 2, reference numeral 30 identifies an apparatus which operates in accordance with the present invention to cut the input/output columns 20b on the integrated circuit package 20. This apparatus 30 includes a flat rectangular base 31; and from each corner of the base 31, an arm 32 extends perpendicular to the base. These four arms 32 support a shear plate 33 which has respective holes 33a through which all of the input/output columns 20b extend. Also the shear plate 33 has a thickness T that equals the length to which the input/output columns 20b are to be cut.

Further included in the apparatus 30 is a blade carrier 34 which slides on the base 31 and passes between the two arms 32 on the right end of the base. This blade carrier 34 has a slot 34a which holds a steel blade 35, such as a razor blade. Also an elastic member 36, such as a rubber member, is squeezed into the slot as shown between the blade 35 and the blade carrier.

One particular feature of the apparatus 30 is that the blade 35 is held in the slot 34a such that only a cutting edge 35a of the blade contacts the shear plate 33, and an acute angle θ of 10° exists between the blade 35 and the shear plate 33 at the point of contact. Another particular feature of the apparatus 30 is that the blade 35 is held in the slot 34a such that the cutting edge 35a of the blade is deflected by the shear plate 33; and to accommodate this deflection without bending the blade, the elastic member 36 compresses and thereby pushes the cutting edge 35a of the blade 35 against the shear plate 33.

In operation, the input/output columns 20b are cut to a length which equals the thickness T of the shear plate 33 simply by sliding the blade carrier 34 to the left on the base 31. During that sliding operation, the cutting edge 35a of the blade 35 stays against the shear plate 33, and it passes through the columns 20b at the point where they exit the shear plate.

Figure 3A:
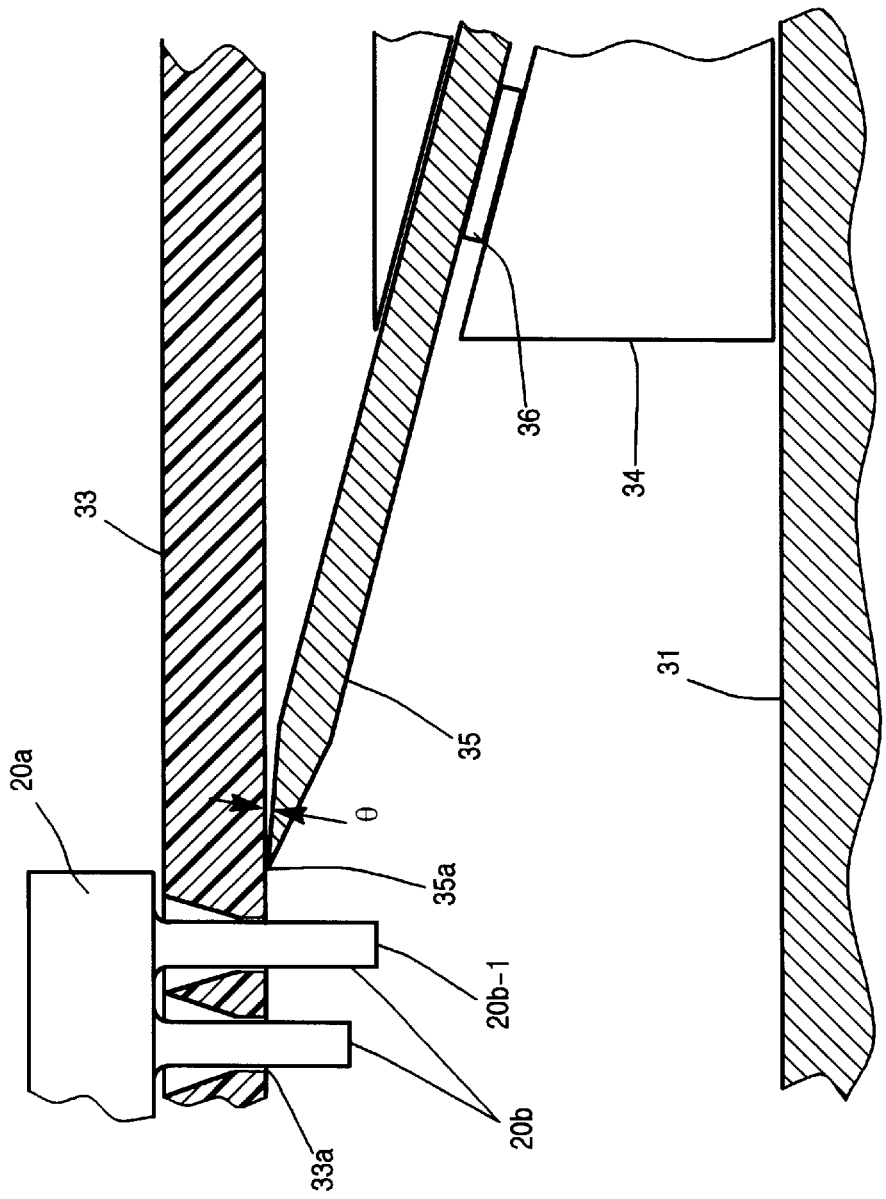
FIG. 3A is an enlarged view of a portion of the apparatus in FIG. 2 which shows a cutting blade immediately before it cuts one of the input/output columns.
Figure 3B:
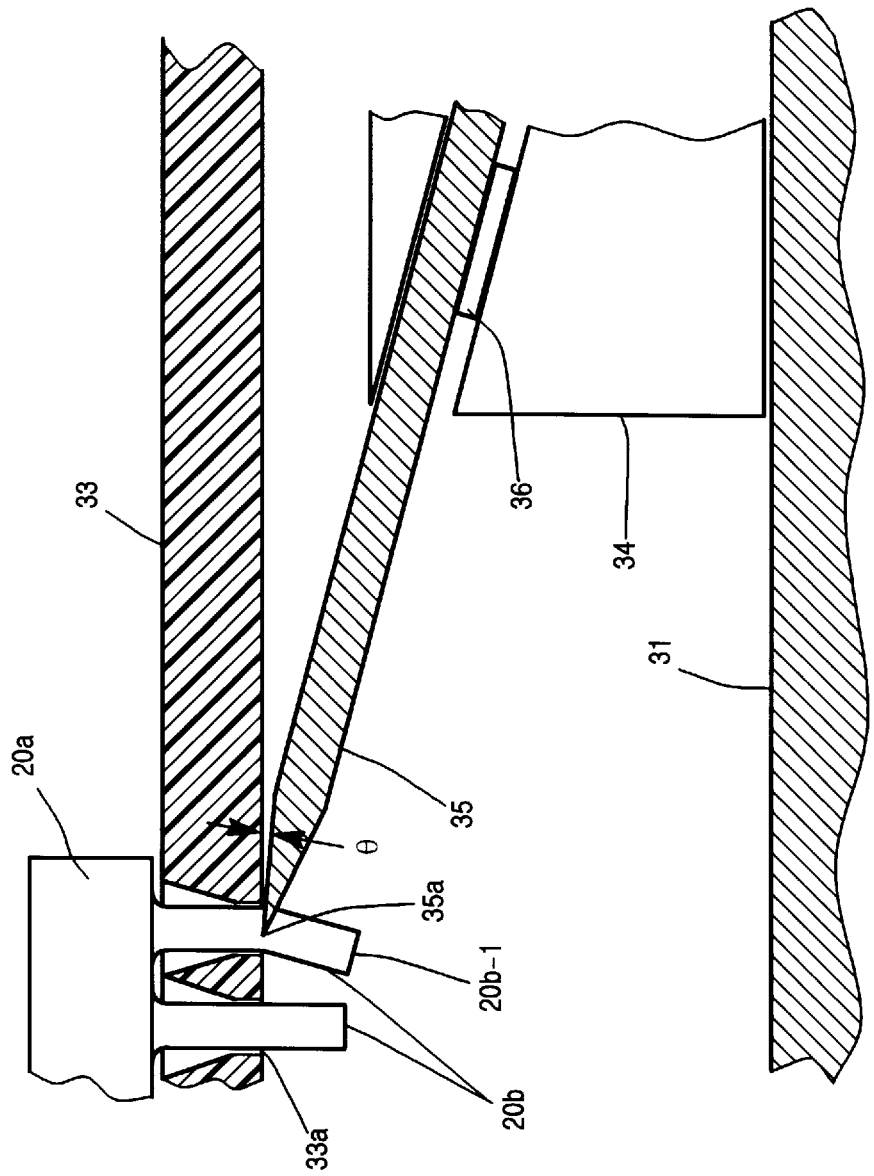
FIG. 3B is an enlarged view of a portion of the apparatus in FIG. 2 which shows a cutting blade as it is cutting one of the input/output columns.
Figure 3C:
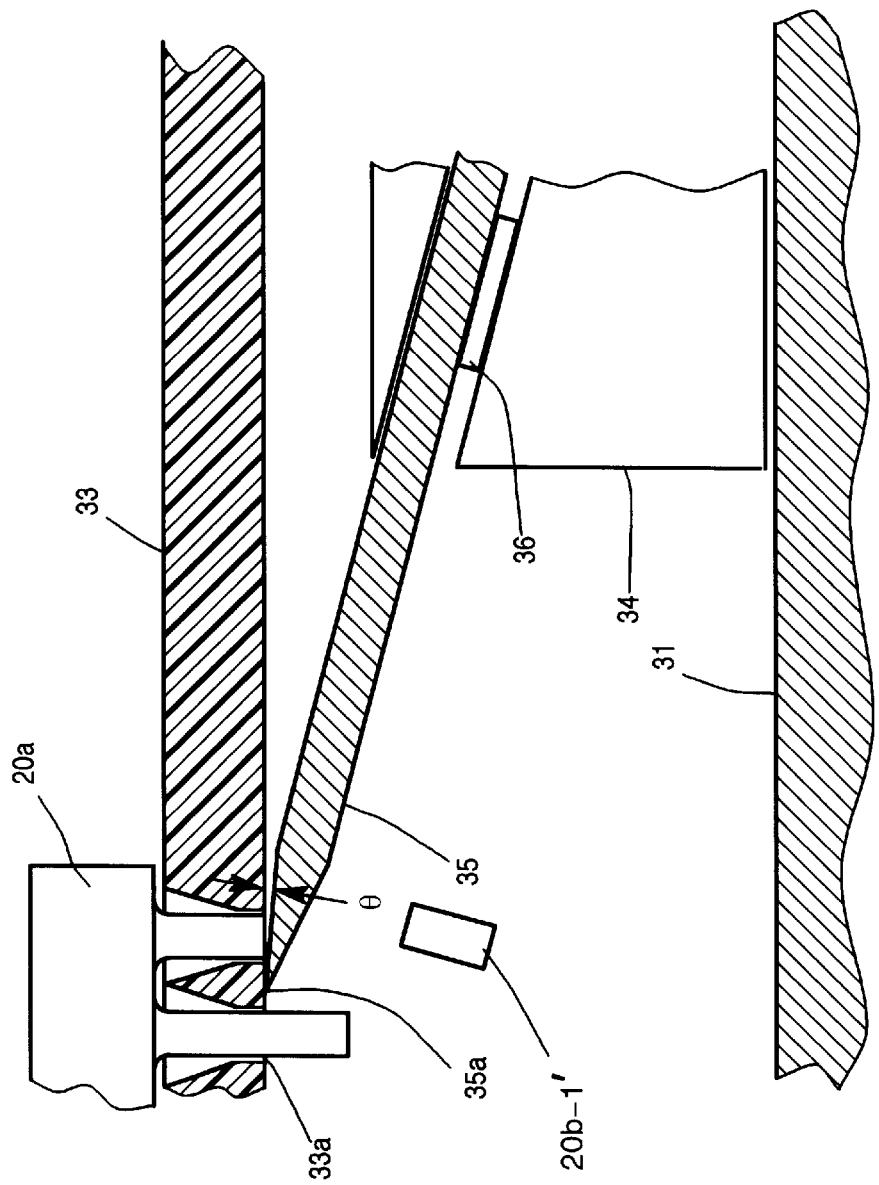
FIG. 3C is an enlarged view of a portion of the apparatus in FIG. 2 which shows a cutting blade immediately after it has cut one of the input/output columns.

This cutting operation is illustrated in detail in FIGS. 3A, 3B, and 3C. In FIG. 3A, the cutting edge 35a of the blade is shown immediately before it begins to cut one particular input/output column 20b-1. In FIG. 3B, the cutting edge 35 of the blade is shown part way through the input/output column 20b-1. In FIG. 3C, the cutting edge 35a of the blade is shown after it has cut completely through the input/output column 20b-1 and removed a portion 20b-1' of that column.

Figure 4:
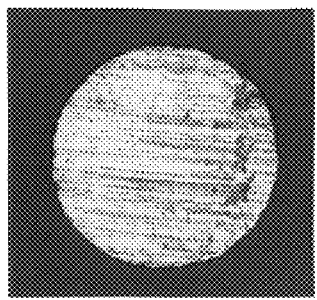
FIG. 4 is a microphotograph of the end of an input/output column which was cut in accordance with the present invention by the apparatus of FIG. 2.

When the input/output columns 20b are cut as described above, one important attribute which those columns acquire is that their cut ends are free of any crater-like voids. This attribute is evident from inspection of FIG. 4 which is a microphotograph of the end of an input/output column 20b which was cut by the above-described process.

Figure 5:
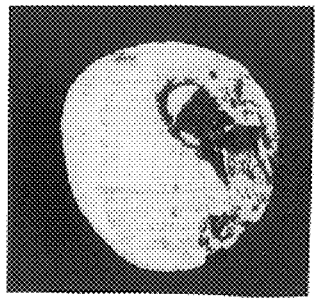
FIG. 5 is a microphotograph of the end of another input/output column which was cut with the prior art apparatus of FIG. 1.

By comparison, FIG. 5 is a microphotograph of an input/output column which was cut by the prior art apparatus and process as previously described in the "Background of the Invention"; and in the FIG. 5 microphotograph, a crater-like void is clearly seen. Such voids are undesirable because they adversely affect the quality of the integrated circuit package 20. For example, a void in the end of an input/output column can weaken a soldered correction between that end of the column and an I/O pad on a printed circuit board. Such a weak connection can crack due to fatigue under normal temperature cycling, and that will cause an open circuit.

Figure 6:
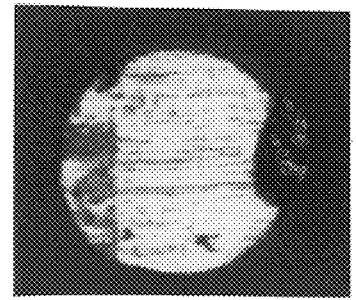
FIG. 6 is a microphotograph of the end of still another input/output column which was cut by the prior art apparatus of FIG. 1.

Also, another important attribute which the input/output columns 20b acquire when they are cut in accordance with the present invention is that the cut ends of the columns are free of any burrs. By comparison, FIG. 6 is a microphotograph of an input/output column which was cut by the prior art apparatus and process as described in the "Background of the Invention"; and in the FIG. 6 microphotograph, a burr is clearly seen as extending from the edge of the column. Such burrs are undesirable because they prevent the integrated circuit package 20 from being removed from the shear plate 33 after the input/output columns 20b have been cut.

With the present invention, the crater-like voids and burrs on the cut ends of the input/output columns 20b are eliminated because only the cutting edge 35a of the blade makes contact with the shear plate 33 and the acute angle θ exists between the blade 35 and the shear plate 33. Due to that structure, the cutting edge 35a of the blade passes cleanly through the input/output columns 20b without any residue from the columns accumulating or smearing on the blade.

By comparison, with the prior art apparatus and process that was previously described in the "Background of the Invention", a microscopic gap inherently exists between the shear plate and the blade. This gap occurs because the surface of the shear plate from which the input/output columns extend cannot be perfectly mated with surface 11a of the cutting blade. Consequently, when the cutting edge of the blade passes through an input/output column, residue from the column can get caught in the gap between the shear plate the cutting blade; and for each input/output column that is cut, the amount of residue which gets caught in the gap builds up. This residue in the gap produces a smear on the cutting blade which causes the crater-like voids as shown in FIG. 5 and burrs as shown in FIG. 6.

One preferred method of cutting input/output columns on an integrated circuit package in accordance with the present invention has now been described in detail; and, one preferred apparatus for performing the steps of that process has also been described in detail. In addition, however, many modifications can be made to the details of, the illustrated process and apparatus without departing from the nature and spirit of the invention.

For example, in FIGS. 2–3C, the integrated circuit package 20 was described as enclosing a single integrated circuit chip. But as an alternative, the package 20 can be a multi chip integrated circuit package. Similarly, the input/output columns which are cut can extend from any type of electronic component.

Also in FIGS. 2–3C, the input/output columns 20b were described as consisting essentially of an alloy of tin and lead. But as an alternative, the columns can also consist essentially of other materials as desired as, for example, copper.

Also, in FIGS. 2–3C, the input/output columns were described as having a diameter of twenty-two mils. But as an alternative, the columns can have any desired diameter. A practical range for the diameter of the columns is five to fifty mils.

Also in FIGS. 2–3C, the cutting blade was described as consisting essentially of steel. But as an alternative, the cutting blade can be made of other materials, such as ceramic.

Also in FIGS. 2–3C, the angle θ which the blade makes with the shear plate was described as an angle of 10°. But as an alternative, that angle can be changed; and preferably, the angle θ is limited to be at least 2° and less than 30°. An angle θ of at least 2° is preferred because it provides a minimum clearance between the blade and the shear plate. This clearance prevents debris from the input/output columns from attaching to the blade 35 as a smear that causes the defects of FIGS. 5–6

Also in FIGS. 2–3C, the elastic member 36 was described as being made of rubber. But as an alternative, any springy material can be used. Further as another alternative, the elastic member 36 can be eliminated so long as the blade 35 is thin enough to bend between the point where it leaves the slot 34a and the cutting edge 35a. With this modification, care must be taken to insure that the blade does not bend so much that the angle θ is reduced below 2°.

Accordingly, it is to be understood that the invention is not limited to just the process and embodiment of FIGS. 2–3C but is defined by the appended claims.

What is claimed is:

1. A method of forming burr-and-crater free connections directly to cut faces on input/output columns which are made of a lead-tin alloy and extend from a body of an electronic component; said method including the steps of:
   providing a shear plate which has respective holes for receiving said columns and which has a thickness that equals a distance from said body along said columns at which said faces are to be cut;
   inserting said columns into said holes until said body of said electronic component rests against said shear plate;
   placing a single blade, which has a gapless tapered end with a cutting edge, against said shear plate such that a) the only portion of said blade which touches said shear plate is said cutting edge and b) said tapered end is at an acute angle with said shear plate and c) no gaps exist between said blade and said shear plate;
   cutting said faces, such that they are free of craters and burrs, by sliding said cutting edge of said single blade against said shear plate and through said lead-tin columns, while keeping said gapless tapered end of said single blade at said acute angle;
   removing said burr-and-crater free faces from said holes in said shear plate;
   contacting said burr-and-crater free faces to respective I/O pads on a flat surface of a printed circuit board, without passing said faces through any holes in said printed circuit board; and,
   soldering said burr-and-crater free faces directly to said respective I/O pads.

2. A method according to claim 1 and further including the step of limiting said angle which said blade makes with said shear plate to be at least two degrees.

3. A method according to claim 1 and further including the step of pressing said cutting edge against said shear plate during said sliding step.

4. A method according to claim 1 and further including the steps of holding said blade with an elastic member, and pressing said cutting edge of said blade against said shear plate with a force that is large enough to deform said elastic member but not said blade.

5. A method according to claim 1 and further including the steps of providing a rigid blade carrier with a slot which holds said blade and inserting an elastic member in said slot against said blade.

6. A method according to claim 1 wherein said columns are five to fifty mils in diameter.

7. A method according to claim 1 wherein said blade consists essentially of ceramic.

8. A method according to claim 1 wherein said blade consists essentially of steel.

9. A method according to claim 1 wherein said blade is a razor blade.

10. A method according to claim 1 wherein said electronic component is a single chip integrated circuit package.

11. A method according to claim 1 wherein said electronic component is a multi chip integrated circuit package.

* * * * *